United States Patent [19]
Tsai et al.

[11] Patent Number: 6,070,851
[45] Date of Patent: Jun. 6, 2000

[54] THERMALLY BUCKLING LINEAR MICRO STRUCTURE

[75] Inventors: Ming-Jye Tsai, Hsinchu Hsien; Ruey-Shing Huang, Hsinchu; Ching-Yi Wu, Hsinchu Hsien, all of Taiwan

[73] Assignee: Industrial Technology Research Institute, Hsinchu, Taiwan

[21] Appl. No.: 09/092,905

[22] Filed: Jun. 8, 1998

[51] Int. Cl.[7] .............................. F16K 31/02; F16K 31/70
[52] U.S. Cl. ........................ 251/11; 251/129.06; 251/368; 60/528; 60/529
[58] Field of Search .................. 251/11, 129.01, 251/129.06, 331, 368; 60/528, 529

[56] References Cited

U.S. PATENT DOCUMENTS

| | | | |
|---|---|---|---|
| 5,029,805 | 7/1991 | Albarda et al. | 251/129.06 X |
| 5,058,856 | 10/1991 | Gordon et al. | 251/11 |
| 5,069,419 | 12/1991 | Jerman | 251/11 |
| 5,344,117 | 9/1994 | Trah et al. | 251/11 |
| 5,529,279 | 6/1996 | Beatty et al. | 251/11 |
| 5,785,295 | 7/1998 | Tsai | 251/11 |

*Primary Examiner*—Kevin Lee
*Attorney, Agent, or Firm*—Pollock, Vande Sande & Amernick

[57] ABSTRACT

A thermally buckling linear micro structure, in which by isolating technology a thermal oxidization isolation layer are generated on the two ends of a micro structure, or a material with larger thermal inflation coefficient is deposited, or the area of thermal conduction is reduced so that the two ends of a micro structure has a larger thermal stress and the membrane structure may be heated uniformly so to cause a thermally buckling deformation, therefore, the deformation of the membrane type micro structure is amplified linearly with the input power. This micro structure is formed as a membrane type by a membrane manufacturing technology.

48 Claims, 4 Drawing Sheets

THERMALLY BUCKLING LINEAR MICRO STRUCTURE

BACKGROUND OF THE INVENTION

1. Field of the Invention

The present invention is related to a thermally buckling micro structure, especially to a thermally buckling linear micro structure, this structure could be further designed for being applied in microminiature valve, or micro flow switch, or micro pump, or other devices.

2. Description of the Prior Art

The defect of the thermally buckling is that the membrane must be heated to a limit temperature in order to deform by thermal inflation. Thus it may not be used in a linear controlled device. U.S. Pat. No. 5,058,856 discloses a conventional thermally buckling device.

For the problem of nonlinear deformation, Barth et al. has been discussed in U.S. Pat. No. 5,333,831 (refer to FIG. 4, and line 56, field 5 and line 10, field 6), but the application of thermally buckling has not been disclosed in the Patent for improving the valve nonlinear opens in a sudden manner.

Barth et al. ever introduces the end portion of a membrane in U.S. Pat. No. 5,323,999, however, this structure is possibly difficult to manufacture.

The inventor of the present invention has discovered a fact that if the thermally buckling membrane may be heated uniformly, the linear deformation of the membrane will be improved. This discovery has not published in any document, the manner for uniformly heating the membrane has also not been disclosed.

SUMMARY OF THE INVENTION

Accordingly, the object of the present invention is to provide a thermally buckling linear micro structure.

Another object of the present invention is to provide a thermally buckling linear micro structure which is formed by an isolation technology of the CMOS manufacturing process.

A next object of the present invention is to provide a thermally buckling linear micro structure which is formed by a intersect micro bridge structure.

A still object of the present invention is to provide a thermally buckling linear micro structure which is formed by depositing materials on the two ends of the membrane, wherein the difference of thermal inflation coefficient of the materials is large.

A further object of the present invention is to provide a thermally buckling linear micro structure which is formed by reducing the volumes of the two ends of the micro bridge so to decrease the heat be dispersed.

The other object of the present invention is to a thermally buckling linear micro structure which is formed by volume deposition technology.

By the technology of the present invention, the driving voltage and power consumption of thermally buckling micro structure will become smaller, but the driving travel and the force generated by the membrane will become large and the CMOS manufacturing process and circuit are easy to be used during integrating. Based on the reason of forming thermally buckling (from the stress variation on the two ends of the membrane), thus the technology of the present invention is to cause a larger thermal stress or temperature difference on the two ends of the membrane so that the thermally buckling may attain a preferred linear variation. In the present invention, a proper isolation layer is formed on each end of the membrane or the area between the two ends and the base of the bridge piers is reduced so that a locate high temperature difference on the two ends thereof are caused. In the present invention, materials with high thermal inflation coefficients are deposited on the two ends of the membrane for providing higher sideward inner stress, or by a micro bridge structure with cruciform or intersect form micro bridge structure, the thermally buckling micro structure may attain a linear variation.

When said preferred thermally buckling micro structure may attain a linear variation, it may be used in an optic system so that a focused transmission mirror may be moved slightly thereby, thus the focus position may be changed so to become an extremely compact micro focus variation means.

Besides, the preferred thermally buckling micro structure may be used in the diaphragm of a micro pump. The pressure chamber adjacent with the diaphragm has an unidirectional inlet and an unidirectional outlet. By the intermittent linear deformation of the thermally buckling, the micro pump may more precisely control the applied pressure of the fluid.

Of course, in usual microminiature valve, the micro structure will improve the precision thereof.

The present invention will be better understood and its numerous objects and advantages will become apparent to those skilled in the art by referencing to the following drawings in which:

DETAILED DESCRIPTION OF THE PREFERRED EMBODIMENT

As aforementioned description, it has discovered from the research of the present invention that if the membrane type micro bridge of the thermally buckling linear micro structure may be improved during heating so that all parts of the micro bridge may be heated uniformly, then the deformation of the thermally buckling may be linearly varied effectively, thus the driving voltage could be reduced effectively, and the travel of the membrane type micro bridge becomes larger, and the precision for controlling the fluid flow is increased apparently.

Figure 1:
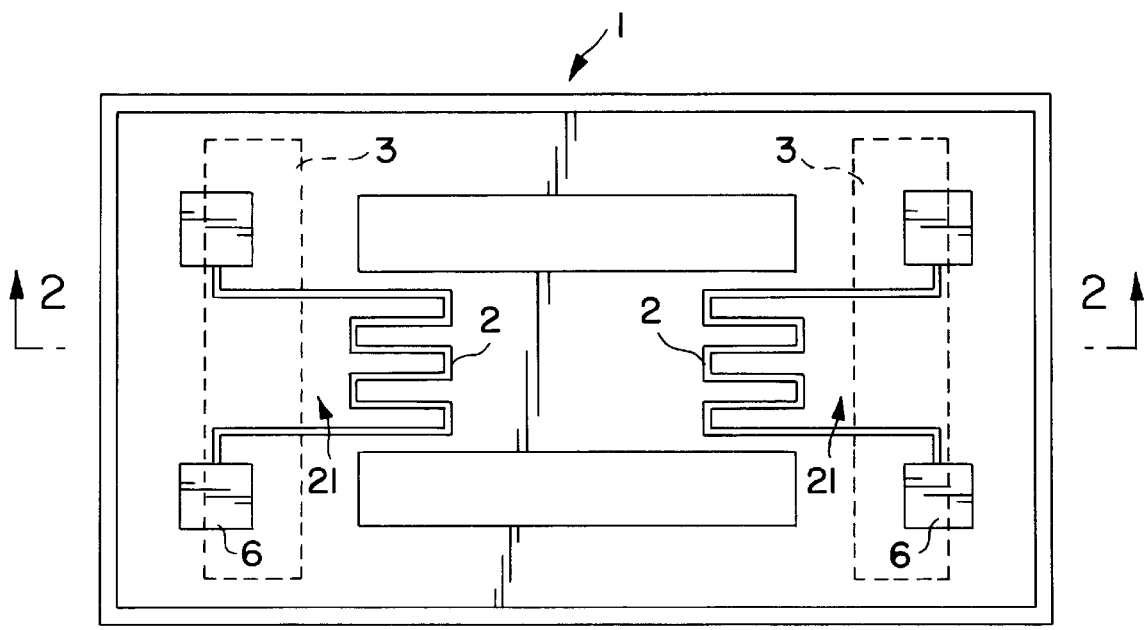
FIG. 1 is an elevational view of the thermally buckling linear micro structure in the present invention.
Figure 2:
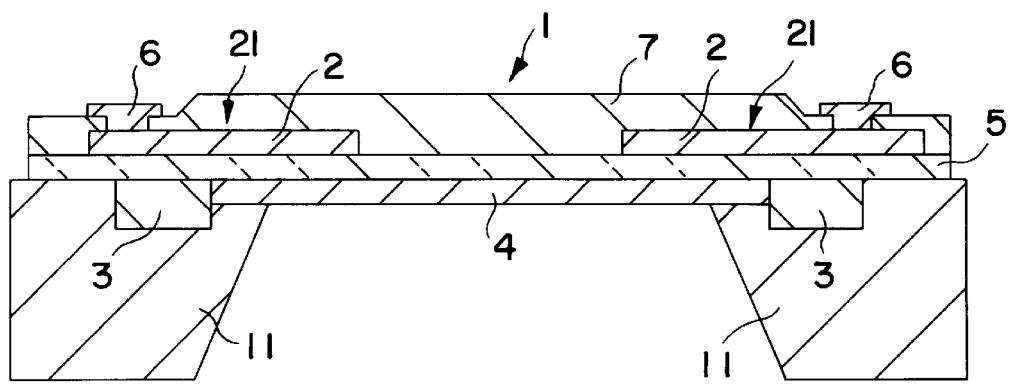
FIG. 2 is a cross sectional view along the line 2—2 in FIG. 1.

The embodiment for improving the uniformly heating of the micro bridge will be described in the following:

At first, referring to FIGS. 1 and 2, the thermally buckling linear micro structure of the present invention comprises a micro bridge (1) which has a bridge pier layer. This bridge pier layer has a plurality of bridge piers which are separated with each other, and the micro bridge structure (1) has further a heating layer (2), when the current is conducted for heating, the micro bridge structure (1) will buckle to deform due to thermal inflation. The plurality of end portions (21) of the micro bridge (1) are located across the bridge piers (11) and a heat isolating layer (3) is located between the each of the end portions (21) and each of the bridge piers (11) for reducing the heat generated by heating layer (2) and transferring to bridge pier layer.

Practically, other than bridge pier layer, the micro bridge structure further includes an etching stop layer (4) located across on the central part of each of the bridge piers (11), and the etching stop layer (4) is made from a material with a large heat isolating layer coefficient for forming the bottom layer of the micro bridge structure. Another electric insulating layer (5) is located on the etching stop layer (4), while the heating layer (2) is located on the etching stop layer (5). Besides, an electric signal connecting layer (6) is combined with the heating layer (2). The electric signal connecting layer (6) is used to connect to an electric signal processing and supply unit (not shown in figure). The micro bridge structure of the present invention mainly comprises an etching stop layer (4), an electric insulating layer (5), and a heating layer (2). Moreover, it is preferred that the heating layer (2) has a protecting layer (7) enclosing the heating layer (2)

In the preferred embodiment, for the material formed aforementioned structure, the bridge pier (11) belonged to the bridge pier layer is formed by silicon substrate; the etching stop layer (4) is made from epitaxial layer or boron (P+); the electric signal connecting layer (6) is made from aluminum, gold or platinum. In the embodiment of heat insulating layer (3), the heat insulating layer (3) is formed by forming a deeper heat isolating layer (3) on the bridge pier layer by oxidizing. In another embodiment, the heat insulating layer is formed by depositing polyimide or $SiO_2$. As for the protecting layer (7), it is suggested to be formed by silicon nitride ($Si_3N_4$) or other proper material.

In above embodiment, the shape of the micro bridge structure and number of bridge piers may be varied.

Figure 3:
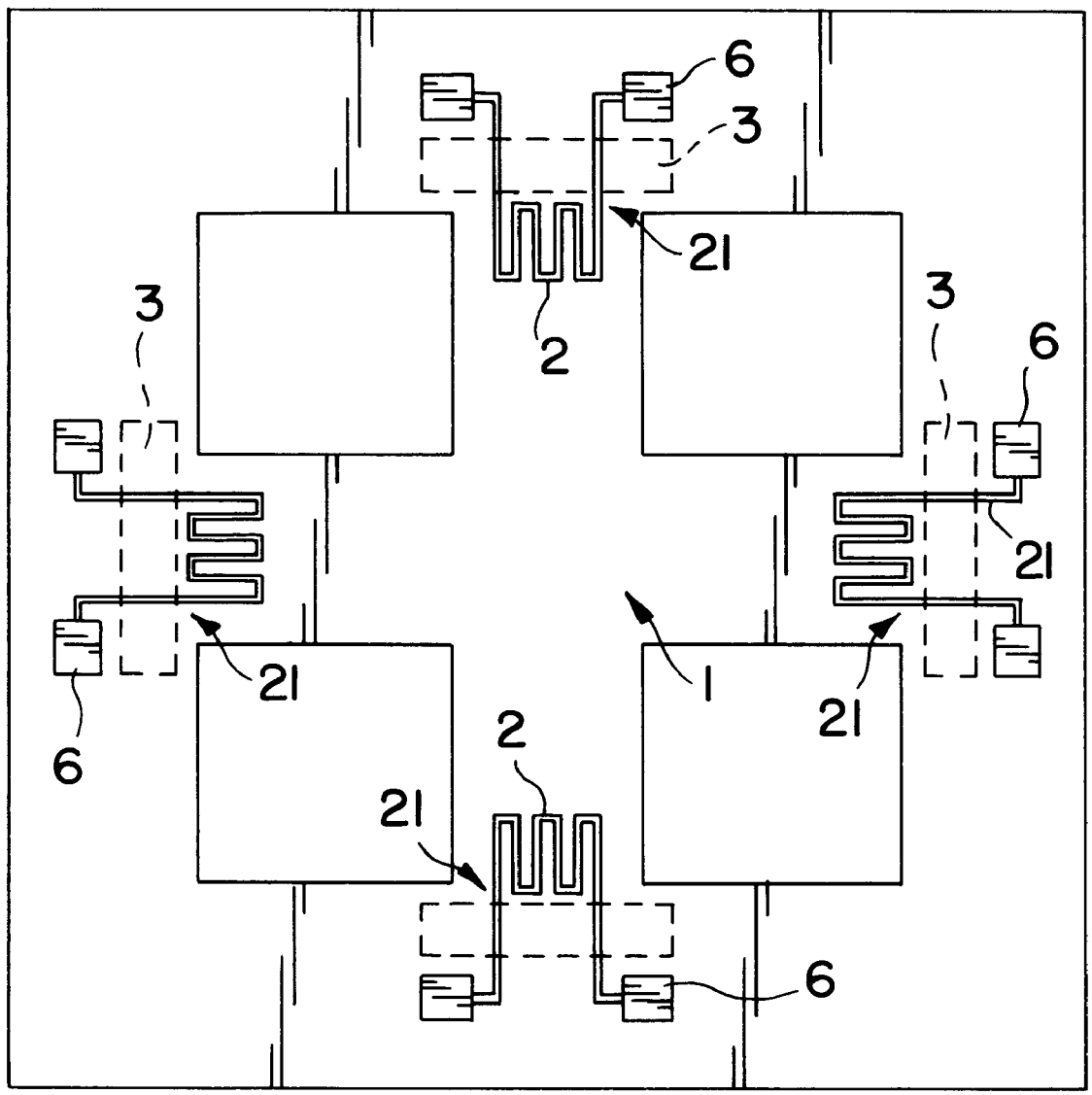
FIG. 3 is an elevational view of the second embodiment in the present invention.

In the exemplary example shown in FIG. 1, the micro bridge structure has right and left ends, then each end is installed across on one of a pair of bridge piers. A more preferred method is that there are more micro bridge portions each of which is installed across on a bridge pier. FIG. 3 shows that the micro bridge structure (1) has a cruciform, the four end portions (21) thereof are connected across on one bridge pier, respectively. This structure will cause that the micro bridge structure has a larger driving force and cause that the micro bridge has a preferred linear variation. Other than the cruciform, the micro bridge structure may has a star form, or other spoke form in which multiple ends are concentrated in the center.

Figure 4:
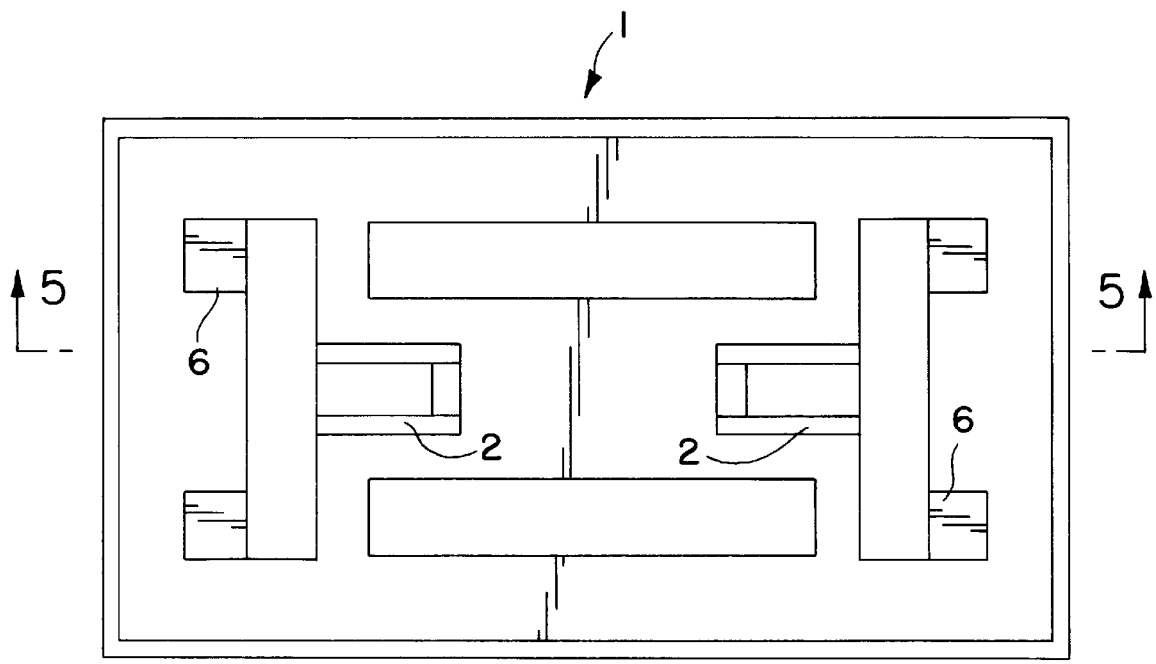
FIG. 4 is an elevational view of the third embodiment in the present invention.
Figure 5:
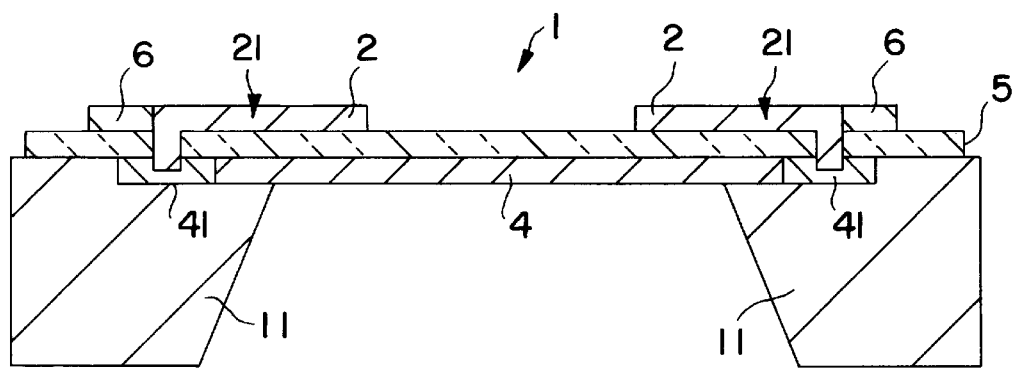
FIG. 5 is a cross sectional view along the line 5—5 in FIG. 4.

FIGS. 4 and 5 show another embodiment, the most difference between this embodiment and the aforementioned embodiment is that a thermal inflation coefficient inertial layer (41) is formed between each bridge pier (11) of the micro bridge structure (1), thus the larger sideward stress can be generate on the end portion of the micro bridge.

The material of the thermal inflation coefficient inertial layer (41) has a heat isolating layer coefficient which is a larger difference with that of the micro bridge heat isolating layer buckling deformation, for example, if epitaxial layer or boron (P⁺) is used as the material of the etching stop layer (4), the inertial layer is formed by aluminum. The object of such a design is to induce a dual metal effect on the two ends of the membrane and a local larger inner sideward stress is generated on the end portion of the micro bridge.

Figure 6:
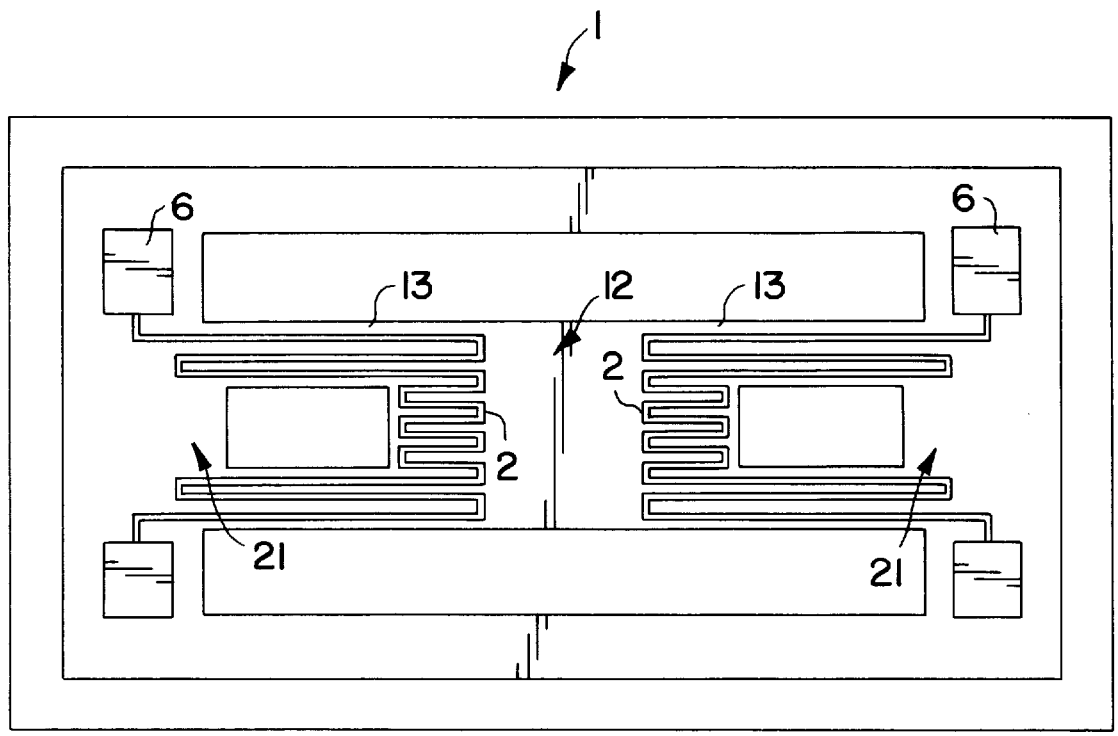
FIG. 6 is an elevational view of the fourth embodiment in the present invention.

Based on aforementioned results of the present invention, if when the micro bridge structure is heated, the heat could not be dispersed from the periphery thereof so that all part of the micro bridge may be heated uniformly, then the deformation of thermally buckling may present a linear effect. As shown in FIG. 6, an embodiment for preventing the heat dispersion of a micro bridge structure of the present invention is shown, wherein the micro bridge structure (1) has a bridge body (12) located on the center, and a narrow bridge portion (31) is extended from the periphery of the bridge body (12) and then further extended to form as an end portion (21). As shown in FIG. 6, the narrow bridge portion (13) is formed by cutting through the near center portion. Of course, it may be formed by a neck structure (not shown in figure) so that the structural contact volume between the bridge body (12) and the each of the end portions is reduced. That is, the volume on any cross section of the bridge body (12) will be larger than the volume of the cross section of any narrow bridge portion, and most of the thermal components of the heating layer (2) are distributed on the bridge body (12) so to reduce the heat conduction.

Figure 7:
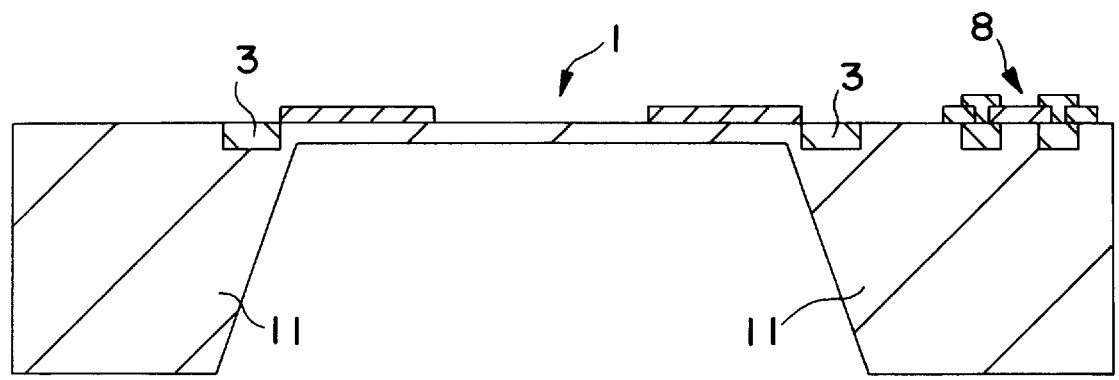
FIG. 7 is a schematic view shown the integration of the present invention with a CMOS circuit.

As shown in FIG. 7, the aforementioned micro bridge embodiment may be formed by CMOS circuit (8) through integrated micro manufacturing process and matching with the etching of a sacrificial layer so to appear the thermally buckling micro bridge structure. By integrating the CMOS circuit, the temperature compensating circuit may be integrated so to compensate the variation of the temperature versus the environment instantaneously.

Above embodiments may be embodied independently or by combining two or more embodiments.

In summary, the technology of the present invention includes the step of batch product through a membrane manufacturing process; generating electric-thermal driving by thermally buckling theory; generating a dual metal structure on the boundary of the membrane; and using standard CMOS manufacturing process. The practical effects of the present invention includes: compact volume, cheap price through batch product, less assembly, higher reliability, a larger force on the traveling of the micro bridge driving and membrane generation, small driving voltage and consumed energy, and integration combination of CMOS and circuit.

Although certain preferred embodiment of the present invention has been shown and described in detail, it should be understood that various changes and modification may be made therein without departing from the scope of the appended claims.

What is claimed is:

1. A thermally buckling linear micro structure having a micro bridge structure which comprises:
    a bridge pier layer has a plurality of bridge piers which are separated from each other;
    a heating layer for conducting current to generate heat such that the micro bridge structure is thermally buckled so to deform due to thermal inflation;
    a plurality of end portions located across from the bridge piers; and
    a heat isolating layer located between each of the end portions and each of the bridge piers for reducing the heat generated by the heating layers which is transferred to the bridge pier layer.

2. The thermally buckling linear micro structure as recited claim 1, further comprising:
    an etching stop layer installed across a central part of each of the bridge piers so to form a bottom layer of the micro bridge structure;

an electric insulating layer formed on the etching stop layer;

the heating layer being formed on the electric insulating layer; and an electric signal connecting layer combined with the heating layer which may be used to connect to an electric signal processing and supply unit.

3. The thermally buckling linear micro structure as recited in claim 2, wherein the micro bridge structure has two ends separated by the etching stop layer and each end is located across from on of the bridge piers via the heat isolation layer.

4. The thermally buckling linear micro structure as recited in claim 2, wherein the heating layer has a protecting layer for enclosing the heating layer.

5. The thermally buckling linear micro structure as recited in claim 2, wherein the bridge pier layer is formed by silicon substrate material.

6. The thermally buckling linear micro structure as recited in claim 2, wherein the etching stop layer is formed by epitaxial layer.

7. The thermally buckling linear micro structure as recited in claim 2, wherein the electric signal connecting layer is formed by aluminum substrate material.

8. The thermally buckling linear micro structure as recited in claim 2, wherein the heat insulating layer is formed by oxidizing a deeper heat isolating layer on the bridge pier layer.

9. The thermally buckling linear micro structure as recited in claim 2, wherein the heat insulating layer is formed by depositing polyimide.

10. The thermally buckling linear micro structure as recited in claim 4, wherein the protecting layer is formed by silicon nitride $Si_3N_4$.

11. The thermally buckling linear micro structure as recited in claim 1, wherein the thermally buckling linear micro structure has a pair of said bridge piers.

12. The thermally buckling linear micro structure as recited in claim 1, wherein the thermally buckling linear micro structure has four bridge piers so that the micro bridge structure has a cruciform of four end portions of which are located across from said bridge piers, respectively.

13. The thermally buckling linear micro structure as recited in claim 2, wherein the micro bridge structure has two ends separated by the etching stop layer and each end is located across from one of the bridge piers via the heat isolation layer.

14. A thermally buckling linear micro structure having a micro bridge structure which comprises:

a bridge pier layer having a plurality of bridge piers which are separated from each other;

a heating layer for conducting current to generate heat such that the micro bridge structure is thermally buckled so to deform due to thermal inflation;

a plurality of end portions located across from the bridge piers; and a thermal inflation coefficient inertial layer being formed between two of the ridge piers, whereby a sideward stress can be generated on an end portion of the micro bridge structure which is sufficient to cause the micro bridge structure to be linearly deformed.

15. The thermally buckling linear micro structure as recited in claim 14, further comprising:

an etching stop layer installed across from a central part of each of the bridge piers and the etching stop layer being formed by a material having a relatively large thermal inflation coefficient so to form a bottom layer of the micro bridge structure;

an electric insulating layer formed on the etching stop layer;

the heating layer being formed on the electric insulating layer; and an electric signal connecting layer combined with the heating layer which may be used to connect to an electric signal processing and supply unit.

16. The thermally buckling linear micro structure as recited in claim 15, wherein the heating layer has a protecting layer for enclosing the heating layer.

17. The thermally buckling linear micro structure as recited in claim 15, wherein the bridge pier layer is formed by silicon substrate material.

18. The thermally buckling linear micro structure as recited in claim 15, wherein the etching stop layer is formed by epitaxial layer.

19. The thermally buckling linear micro structure as recited in claim 15, wherein the electric signal connecting layer is formed by aluminum substrate material.

20. The thermally buckling linear micro structure as recited in claim 15, wherein the electric signal connecting layer is formed by platinum.

21. The thermally buckling linear micro structure as recited in claim 15, wherein the thermal inflation coefficient inertial layer is formed by oxidizing a deeper heat isolating layer on the bridge pier layer.

22. The thermally buckling linear micro structure as recited in claim 15, wherein the heat insulating layer is formed by depositing aluminum substrate material.

23. The thermally buckling linear micro structure as recited in claim 16, wherein the protecting layer is formed by silicon nitride $Si_3N_4$.

24. The thermally buckling linear micro structure as recited in claim 14, wherein the thermally buckling linear micro structure has a pair of said bridge piers.

25. The thermally buckling linear micro structure as recited in claim 14, wherein the thermally buckling linear micro structure has four said bridge piers so that the micro bridge structure has a cruciform of four end portions which are located across from said bridge piers, respectively.

26. A thermally buckling linear micro structure having a micro bridge structure which comprises:

a bridge pier layer having a plurality of bridge piers which are separated from each other;

a heating layer formed by electric components for conducting current to generate heat such that the micro bridge structure is thermally buckled to deform due to thermal inflation;

a bridge body located on the center portion of the micro bridge structure; said bridge body having a periphery extending therefrom in the form of multiple narrow bridge portions, each being further extended to form an end portion; and a heat isolating layer located between each end portion and each bridge pier for reducing the heat generated by the heating layer to transfer to the bridge pier layer.

27. The thermally buckling linear micro structure as recited in claim 26, wherein the thermally buckling linear micro structure has a pair of said bridge piers.

28. The thermally buckling linear micro structure as recited in claim 26, wherein the thermally buckling linear micro structure has four said bridge piers so that the micro bridge structure has a cruciform of four end portions which are located across from said bridge piers, respectively.

29. A thermally buckling linear micro structure having a micro bridge which comprises:

a bridge pier layer having a plurality of bridge piers which are separated from each other;

a heating layer formed by electric components for conducting current to generate heat such that the micro bridge structure is thermally buckled to deform due to thermal inflation; and a bridge body located on a center portion of the micro bridge structure, said bridge body having a periphery extending therefrom in the form of multiple narrow bridge portions, each being further extended to form an end portion; said bridge body having a cross section larger than that of each narrow bridge portion, wherein enough of the components of thermal capacity associated with the heating layer are distributed on the bridge body so to reduce the heat conduction of the bridge body through the narrow bridge portion and the end portions leading to the bridge pier layer.

30. The thermally buckling linear micro structure as recited in claim 29, wherein a thermal inflation coefficient inertial layer is located between each end portion and each bridge pier for reducing the heat generated by heating layer to transfer to the bridge pier layer.

31. The thermally buckling linear micro structure as recited in claim 30, wherein the micro bridge structure has two ends separated by an etching stop layer and each end is located across from one of the bridge piers via the heat isolation layer.

32. The thermally buckling linear micro structure as recited in claim 30, wherein the heating layer has a protecting layer for enclosing the heating layer.

33. The thermally buckling linear micro structure as recited in claim 30, wherein the bridge pier layer is formed by silicon substrate material.

34. The thermally buckling linear micro structure as recited in claim 30, wherein the etching stop layer is formed by epitaxial layer.

35. The thermally buckling linear micro structure as recited in claim 30, wherein the electric signal connecting layer is formed by aluminum substrate material.

36. The thermally buckling linear micro structure as recited in claim 30, wherein the heat isolating layer is formed by oxidizing a deeper heat isolating layer on the bridge pier layer.

37. The thermally buckling linear micro structure as recited in claim 30, wherein the heat insulating layer is formed by depositing polyimide.

38. The thermally buckling linear micro structure as recited in claim 32, wherein the protecting layer is formed by silicon nitride $Si_3N_4$.

39. The thermally buckling linear micro structure as recited in claim 29, comprising:

an etching stop layer installed across a central part of each of the bridge piers so to form a bottom layer of the micro bridge;

an electric insulating layer formed on the etching stop layer;

the heating layer being formed on the electric insulating layer; micro bridge structure is formed by the etching stop layer, the electric and an electric signal connecting layer combined with the heating layer being used to connect to an electric signal processing and supply unit.

40. The thermally buckling linear micro structure as recited in claim 29, wherein the micro bridge structure has two ends separated by the etching stop layer and each end is located across one of the bridge piers via the heat isolation layer.

41. The thermally buckling linear micro structure as recited in claim 29, wherein the heating layer has a protecting layer for enclosing the heating layer.

42. The thermally buckling linear micro structure as recited in claim 29, wherein the bridge pier layer is formed by silicon substrate material.

43. The thermally buckling linear micro structure as recited in claim 29, wherein the etching stop layer is formed by boron $P^+$.

44. The thermally buckling linear micro structure as recited in claim 29, wherein the electric signal connecting layer is formed by aluminum substrate material.

45. The thermally buckling linear micro structure as recited in claim 29, wherein the electric signal connecting layer is formed by platinum.

46. The thermally buckling linear micro structure as recited in claim 29, wherein the thermal inflation coefficient inertial layer is formed by oxidizing a deeper heat isolating layer on the bridge pier layer.

47. The thermally buckling linear micro structure as recited in claim 29, wherein the heat insulating layer is formed by depositing aluminum substrate material.

48. The thermally buckling linear micro structure as recited in claim 41, wherein the protecting layer is formed by silicon nitride $Si_3N_4$.

* * * * *